United States Patent [19]
Konno

[11] Patent Number: 6,163,212
[45] Date of Patent: Dec. 19, 2000

[54] POWER AMPLIFIER SYSTEM

[75] Inventor: Fumiyasu Konno, Hirakata, Japan

[73] Assignee: Matsushita Electric Industrial Co., Ltd., Osaka, Japan

[21] Appl. No.: 09/230,790

[22] PCT Filed: Jun. 26, 1998

[86] PCT No.: PCT/JP98/02880

§ 371 Date: Feb. 8, 1999

§ 102(e) Date: Feb. 8, 1999

[87] PCT Pub. No.: WO99/00895

PCT Pub. Date: Jan. 19, 1999

[30] Foreign Application Priority Data

Jun. 27, 1997 [JP] Japan .................................. 9-171424

[51] Int. Cl.⁷ ........................................................... H03G 3/20
[52] U.S. Cl. ............................................. 330/133; 330/140
[58] Field of Search ................................ 330/96, 129, 133, 330/134, 136, 140, 141

[56] References Cited

U.S. PATENT DOCUMENTS

| | | | |
|---|---|---|---|
| 5,168,148 | 12/1992 | Giebel | 330/134 X |
| 5,432,473 | 7/1995 | Mattila et al. | 330/133 |
| 5,589,796 | 12/1996 | Alberth et al. | 330/133 |

FOREIGN PATENT DOCUMENTS

| | | |
|---|---|---|
| 56-103510 | 8/1981 | Japan . |
| 58-177022 | 10/1983 | Japan . |
| 60-45518 | 3/1985 | Japan . |

OTHER PUBLICATIONS

Search report corresponding to application No. PCT/JP98/02880 dated Sep. 29, 1998.
English translation of Form PCT/ISA/210.

*Primary Examiner*—Steven J. Mottola
*Attorney, Agent, or Firm*—Ratner & Prestia

[57] ABSTRACT

A power amplifier system is used for numerous types of audio equipment, and prevents output distortion of the amplifier from deteriorating, under any condition, by controlling a voltage-controlled amplifier in response to fluctuation of an input signal and a power supply voltage. The power amplifier system includes a limiter that extracts a signal at a point of connection between a voltage amplifier and a power amplifier, converts the signal into a d.c. voltage with an integrating circuit after passing it through a voltage comparator, and varies the degree of amplification of a voltage control amplifier, so as to maintain an output voltage at a constant distortion ratio by application of a voltage limited according to an output level of the power amplifier.

20 Claims, 11 Drawing Sheets

Reference Numerals

1  Input terminal

2  Voltage-controlled amplifier

3  Voltage amplifier

4  Negative feedback circuit

5  Power amplifier

6  Speaker

7  Voltage comparator

8  Integrating circuit

9  Power amplifier system

18  Voltage comparator

19  Inverting amplifier

28  Adder

44  Voltage comparator

POWER AMPLIFIER SYSTEM

This application is a U.S. National Phase Application of PCT International Application PCT/JP98/02880.

FIELD OF THE INVENTION

The present invention relates to a power amplifier system for use in numerous kinds of audio equipment.

BACKGROUND OF THE INVENTION

An example of a power amplifier system of the prior art is described by referring to FIG. 11. A signal fed in an input terminal 1 passes through a voltage-controlled amplifier 2, and drives a speaker 6, after it is amplified by a power amplifier system 9 comprising a negative feedback circuit 4, a voltage amplifier 3 and a power amplifier 5. In order to prevent the speaker 6 from being input with an excessive power or to avoid a distorted sound due to a wave form being electrically clipped by exceeding a dynamic range, a limiter means has been used in the past, which detects an output of the voltage-controlled amplifier 2, e.g. an input voltage of the power amplifier system 9, converts it into a pulse wave by a voltage comparator 7, converts the voltage into a d.c. signal by integrating it with an integrating circuit 8, and reduces an amplification factor of the voltage-controlled amplifier 2, so as to suppress a wave form distortion of the output.

However, since the composition of the prior art detects and controls only a magnitude of the input signal, it has been unable to control clipping within the power amplifier system 9 itself or clipping at an output stage caused by fluctuation of the power supply voltage, so as to result in a problem of generating a distortion from the speaker.

SUMMARY OF THE INVENTION

A power amplifier system of the present invention is composed of a limiter means that detects a voltage at a point of connection between a voltage amplifier and a power amplifier, and controls a voltage-controlled amplifier by using the voltage. With an adoption of the above structure, clipping of the signal is prevented due to a magnitude of the input signal, fluctuation of the power supply voltage, etc.

DESCRIPTION OF THE PREFERRED EMBODIMENTS

First Exemplary Embodiment

Figure 1:
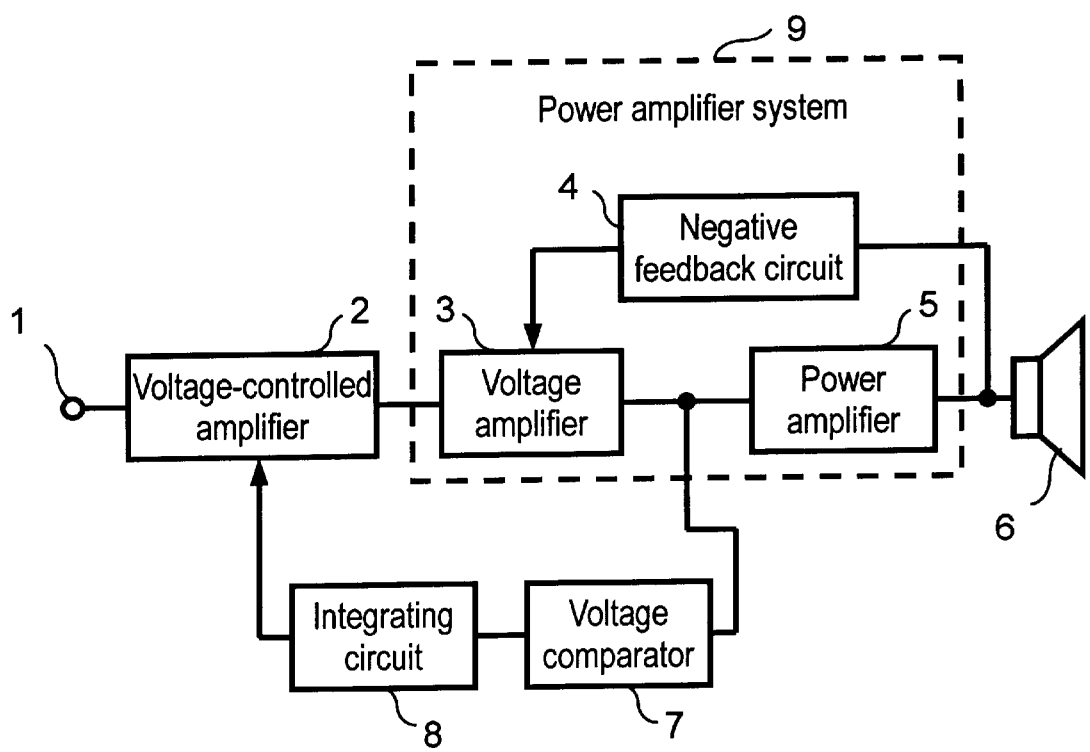
FIG. 1 is a block diagram depicting a power amplifier system of a first exemplary embodiment of the present invention.

FIG. 1 is a block diagram depicting a structure of a limiter circuit of a power amplifier system of a first exemplary embodiment of the present invention. In FIG. 1, a signal supplied to an input terminal 1 is fed to a voltage-controlled amplifier 2, wherein amplitude is limited. An output of the voltage-controlled amplifier 2 is connected to a voltage amplifier 3 at a first stage of the power amplifier system 9. This voltage amplifier 3 is also applied with a voltage fed-back from an output of the power amplifier 5 through a negative feedback circuit 4. An output of the voltage amplifier 3 is connected to the power amplifier 5, and its output power drives a speaker 6. Since a connecting point of the voltage amplifier 3 and the power amplifier 5 is situated within a negative feedback loop of the negative feedback circuit 4, a waveform of the output transforms into a shape in which a bump appears near peak amplitude of the sinusoidal wave as shown by the voltage wave in FIG. 3A, if the wave is clipped. This is due to a negative feedback control that acts to compensate an output signal, since a clipping signal of the output voltage is fed-back to the voltage amplifier 3 through the negative feedback circuit 4, so that clipped information is obtainable by way of connecting the voltage with a voltage comparator 7.

As has been described, the present embodiment constitutes the limiter means having a voltage comparator 7 for comparing a voltage at the connecting point between the voltage amplifier 3 and the power amplifier 5 with a reference voltage, and controls the voltage-controlled amplifier 2 by converting an output voltage of the voltage comparator 7 into a direct current with an integrating circuit 8.

Figure 2:
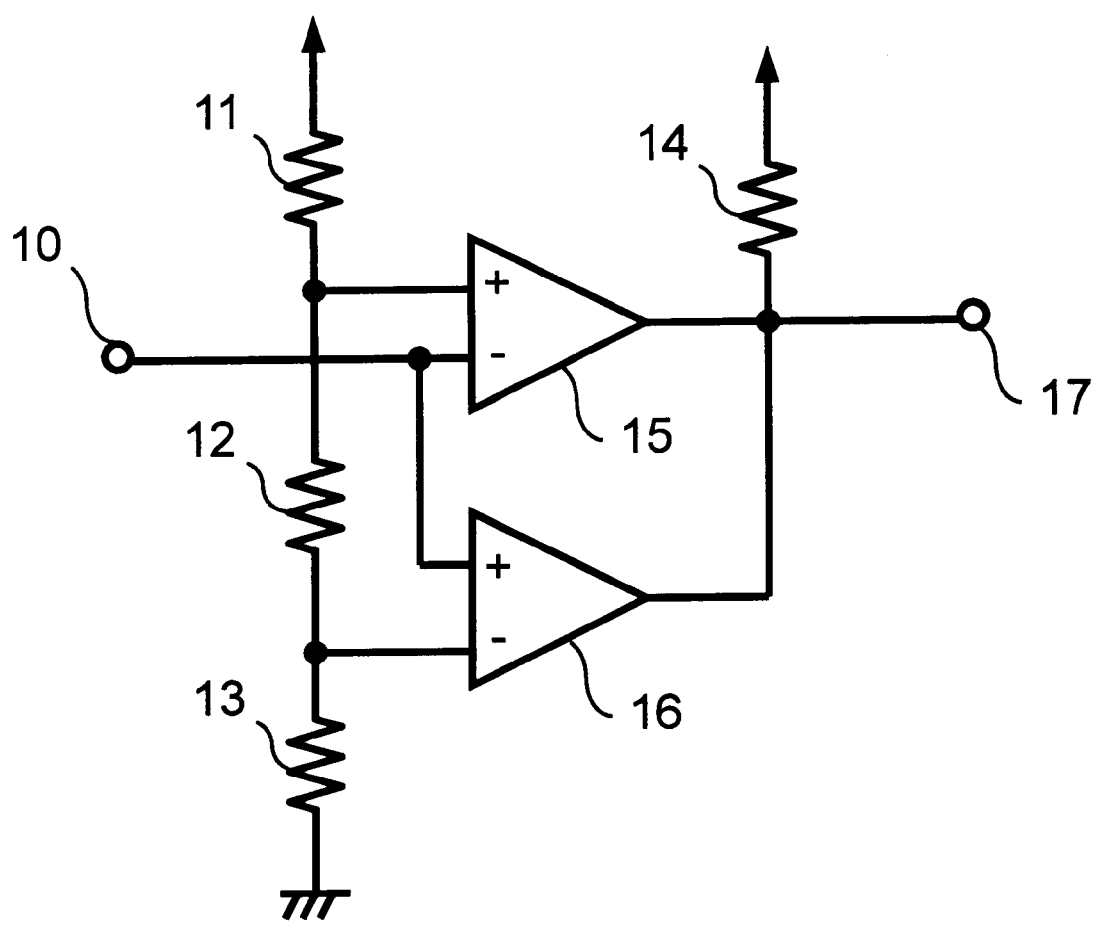
FIG. 2 is a circuit diagram depicting a voltage comparator constituting a limiter circuit of the same system.
Figure 3:
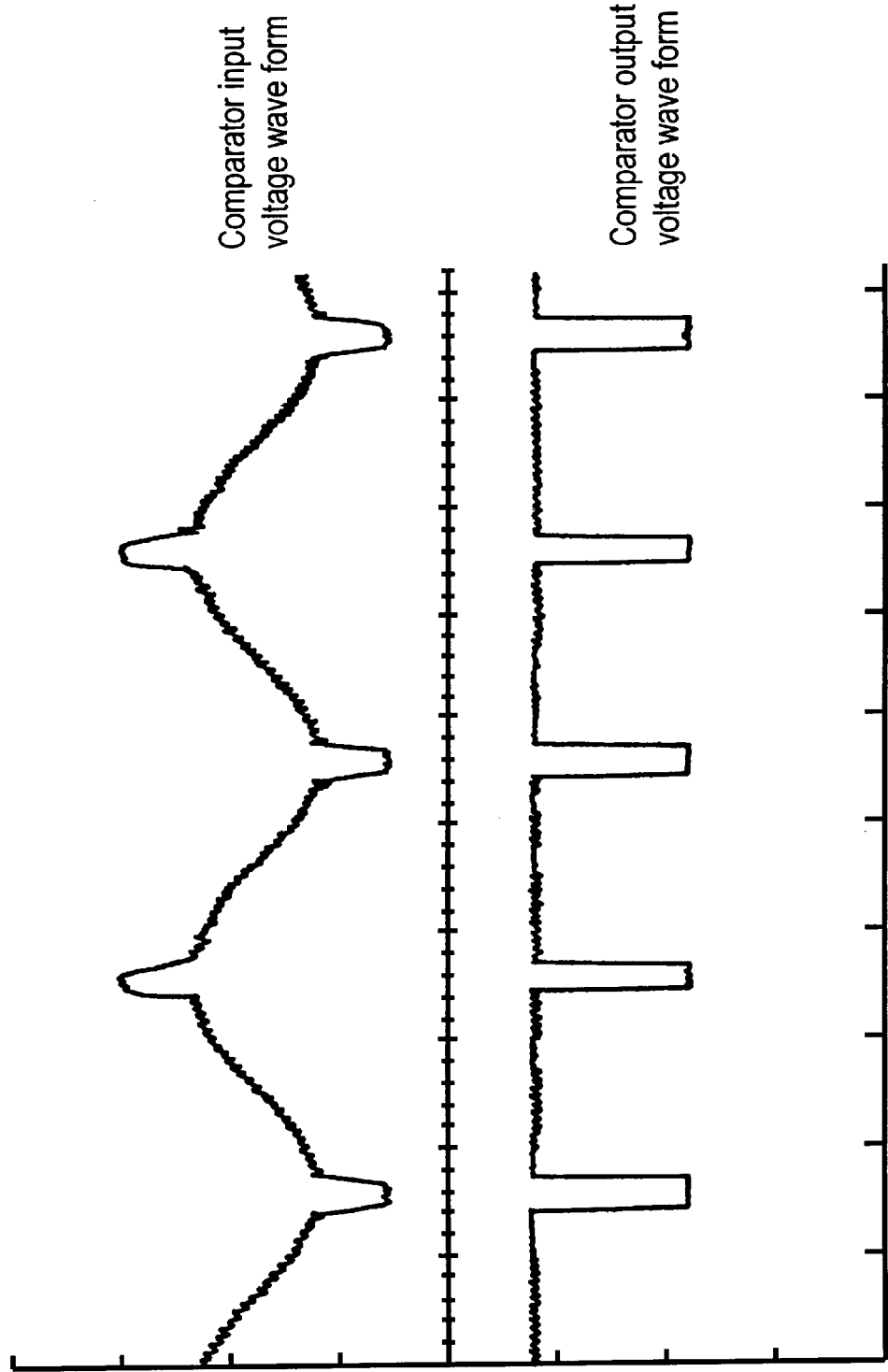
FIG. 3A and FIG. 3B is a drawing showing waveforms of an input voltage and an output voltage of the same voltage comparator.

A window comparator, as it is commonly called, as shown in FIG. 2, is used for the voltage comparator 7. The window comparator is so constructed that an input terminal 10 is connected to an inverting input terminal and a non-inverting input terminal of comparators 15 and 16, the non-inverting input terminal of the comparator 15 and the inverting input terminal of the comparator 16 are applied with the reference voltage through resistors 11, 12 and 13, and a common output terminal of the comparators 15 and 16 applied with a power supply voltage through a resistor 14 is connected to an output terminal 17. An output pulse wave for the window comparator is so designed that a pulse as shown in FIG. 3B is generated, when an output stage is clipped due to an abnormal voltage in a shape of a bump generated as shown in FIG. 3A at a connecting point between the voltage amplifier 3 and the power amplifier 5. This output signal of the voltage comparator 7 is converted into a direct current by the integrating circuit 8, and reduces an amplification factor of the voltage-controlled amplifier 2, so as to eventually avoid clipping of the output of the power amplifier system 9.

Figure 4:
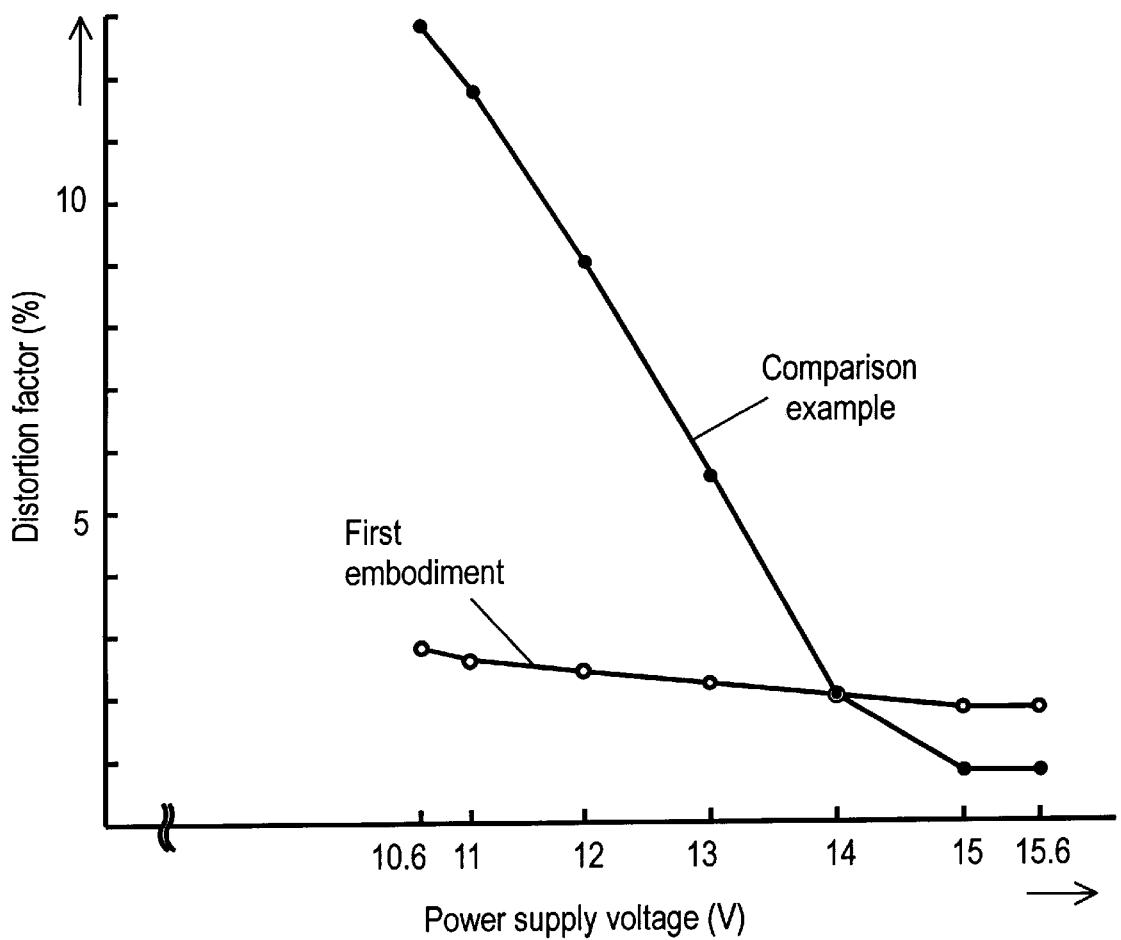
FIG. 4 is a characteristic chart showing a power supply voltage versus a distortion factor of the output voltage for the same system and a comparison example.

FIG. 4 is a chart showing power supply voltage versus distortion factor for the above-described first embodiment and a comparison example, and FIG. 4 shows that an output of a power amplifier system not equipped with a limiter, as represented by the comparison example, is clipped so that its distortion becomes worse as the power supply voltage decreases. With an adoption of the limiter circuit of the present embodiment, however, the distortion factor can be maintained generally constant, and a waveform is not clipped even with a fluctuation of the power supply voltage, since an input voltage is reduced by way of controlling the voltage-controlled amplifier 2 in response to the fluctuation of the power supply voltage.

Second Exemplary Embodiment

Figure 5:
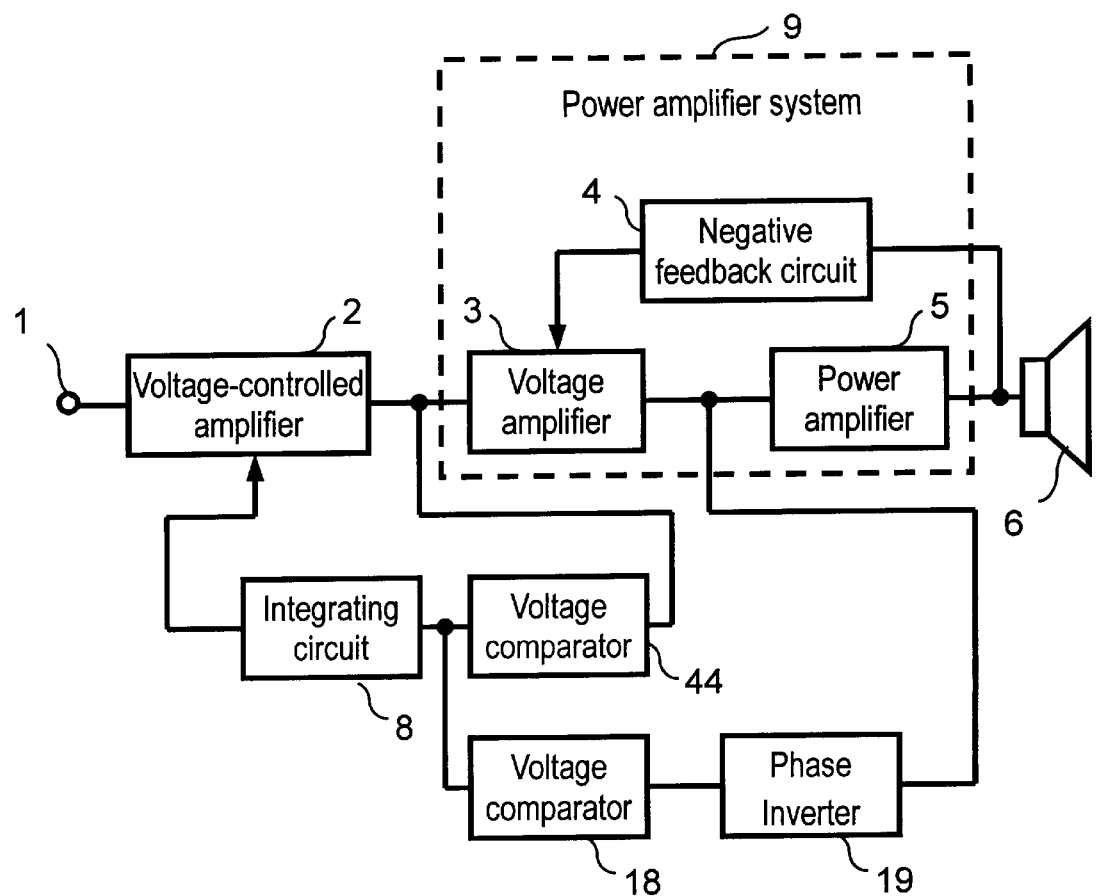
FIG. 5 is a block diagram depicting a power amplifier system of a second exemplary embodiment of the present invention.
Figure 6:
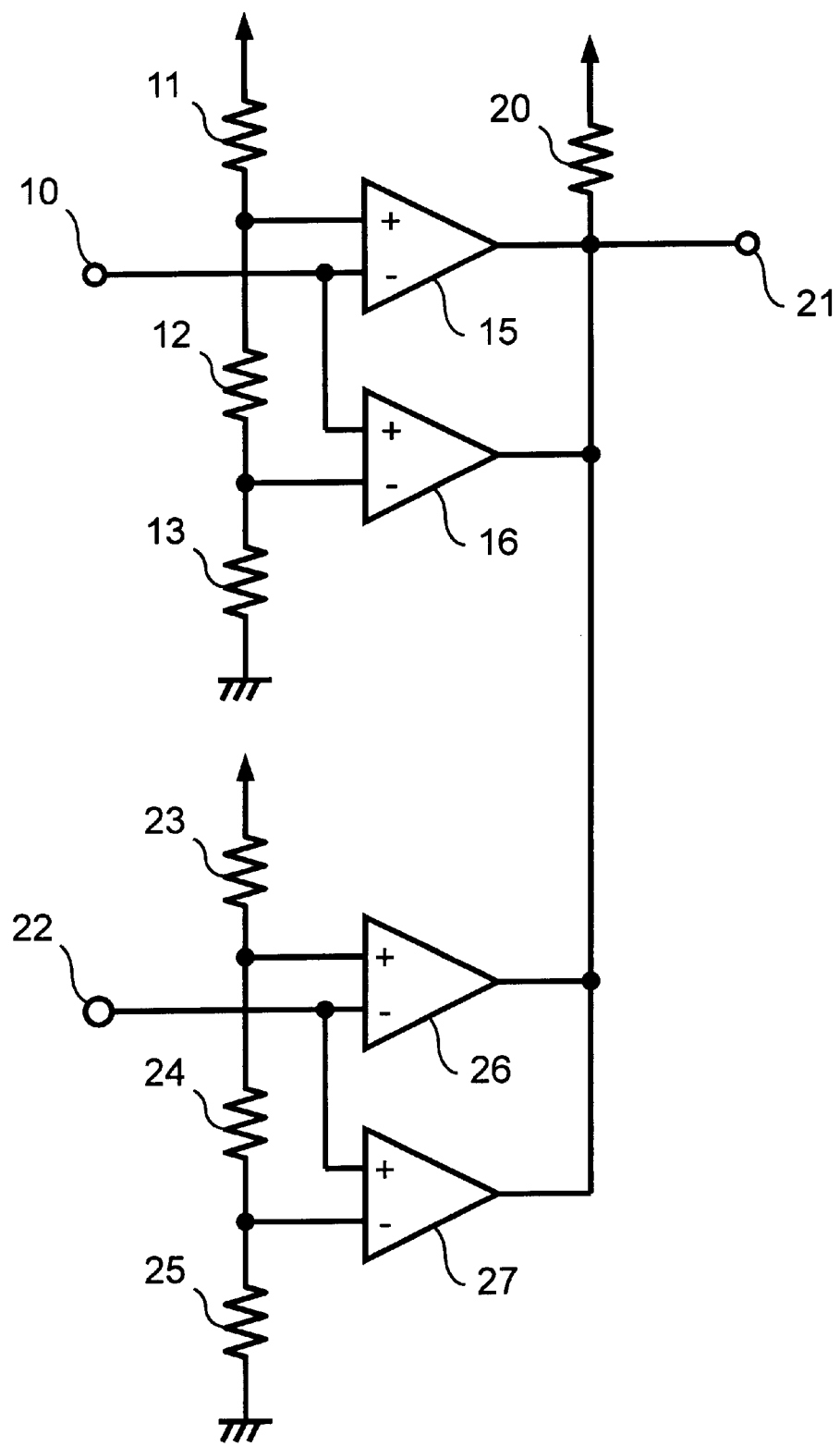
FIG. 6 is a circuit diagram depicting a voltage comparator of the same system.

FIG. 5 is a block diagram depicting a structure of a limiter circuit of a power amplifier system of a second exemplary embodiment of the present invention. This limiter means connects an output signal of the voltage-controlled amplifier 2 with an input of a voltage comparator 44, and it also connects an output signal of the voltage amplifier 3 with a voltage comparator 18 after inverting the phase by passing it through a phase inverter 19, having an amplification factor of 1, converts a sum of the two outputs from the voltage comparators 44 and 18 into a direct current with an integrating circuit 8, and controls the voltage-controlled amplifier 2. A window comparator, as it is commonly called, as shown in FIG. 6, is used for the voltage comparators 44 and 18. The window comparator 44 is the same as the one used in the first exemplary embodiment. In the other window comparator, an input terminal 22 is connected to an inverting input terminal and a non-inverting input terminal of comparators 26 and 27, the non-inverting input terminal of the comparator 26 and the inverting input terminal of the comparator 27 are applied with a reference voltage through resistors 23, 24 and 25, and output terminals of the comparators 26 and 27 are connected together.

Since all of the outputs of these window comparators are of an open collector type, they are directly joined together, and connected to a power supply terminal through a pull-up resistor 20. The outputs of these two window comparators are converted into a direct current by the integrating circuit 8 for varying an amplification factor of the voltage-controlled amplifier 2. Although these two window comparators 44 and 18 generate pulses if individual voltages are exceeded, the window comparator 44 is effective mainly to an excessive input, and the window comparator 18 is effective to clipping of a waveform of the power amplifier, as stated in the first exemplary embodiment. Also, passing through the phase inverter 19 prevents the control voltage from becoming inaccurate due to an overlapping of the output pulses, even when all of the comparators function, since the peak of the waves differ in phase by 180°.

Third Exemplary Embodiment

Figure 7:
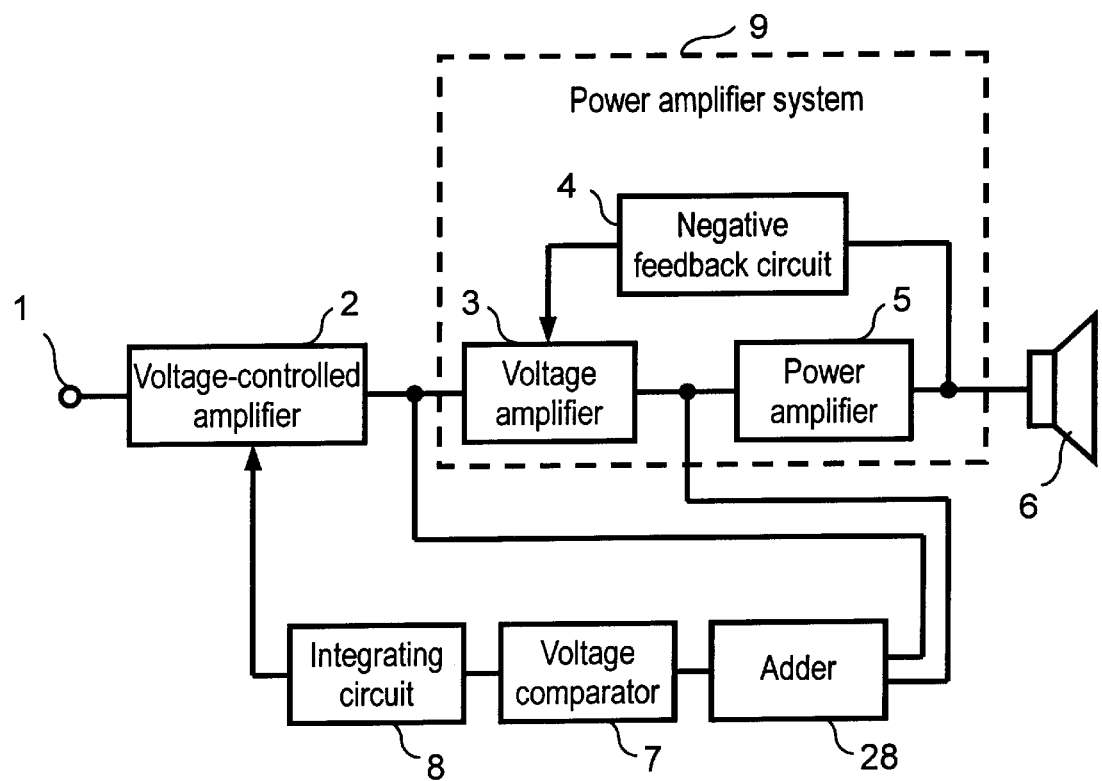
FIG. 7 is a block diagram depicting a power amplifier system of a third exemplary embodiment of the present invention.

FIG. 7 is a block diagram depicting a structure of a limiter circuit of a power amplifier system of a third exemplary embodiment of the present invention. This limiter means produces a sum of output signals by connecting an output signal of a voltage-controlled amplifier 2 and an output signal of a voltage amplifier 3 to an adder 28, connects an output signal of the adder 28 to a voltage comparator 7, and controls an amplification factor of the voltage-controlled amplifier 2 by converting an output of the voltage comparator 7 into a direct current by passing it through an integrating circuit 8. This structure generally has the same characteristic as the second exemplary embodiment.

Fourth Exemplary Embodiment

Figure 8:
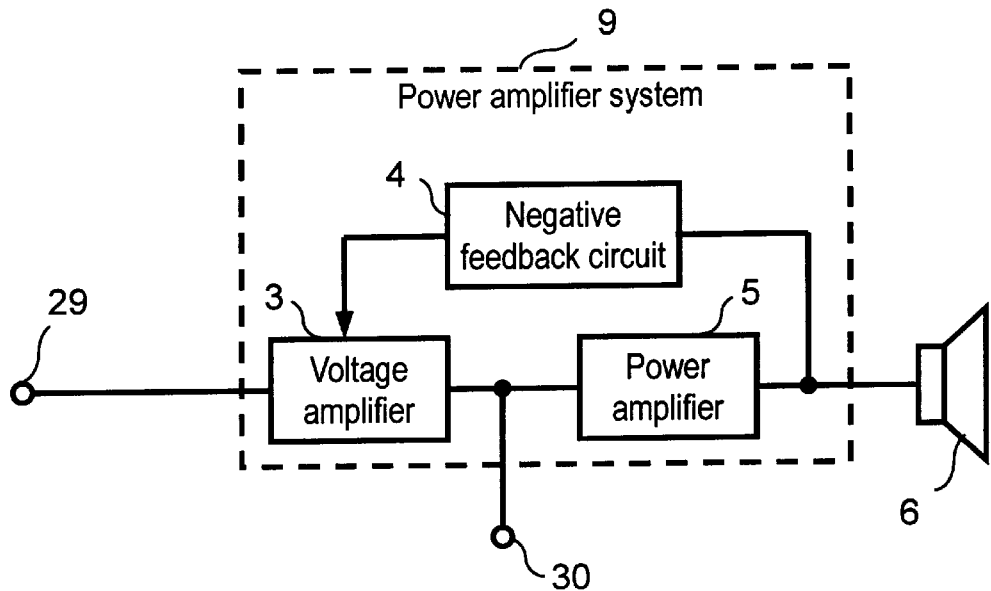
FIG. 8 is a block diagram depicting a power amplifier system of a fourth exemplary embodiment of the present invention.

A fourth exemplary embodiment of the present invention is described hereinafter by referring to FIG. 8. FIG. 8 is a block diagram depicting an excerpted power amplifier system 9 of the present invention. The power amplifier system 9 comprises a voltage amplifier 3, a power amplifier 5 and a negative feedback circuit 4, wherein an overall amplification factor is determined by setting individual amplification factors. If a detected signal output 30 for a limiter circuit is taken from within this circuit block, as in the present embodiment, an amplification factor of the voltage amplifier 3 is equal to or lower than that of the power amplifier 5. Setting it in this way can prevent the detected signal from becoming inaccurate due to clipping of the voltage amplifier 3 before a clipping of waveforms occurs in the power amplifier 5.

Fifth Exemplary Embodiment

Figure 9:
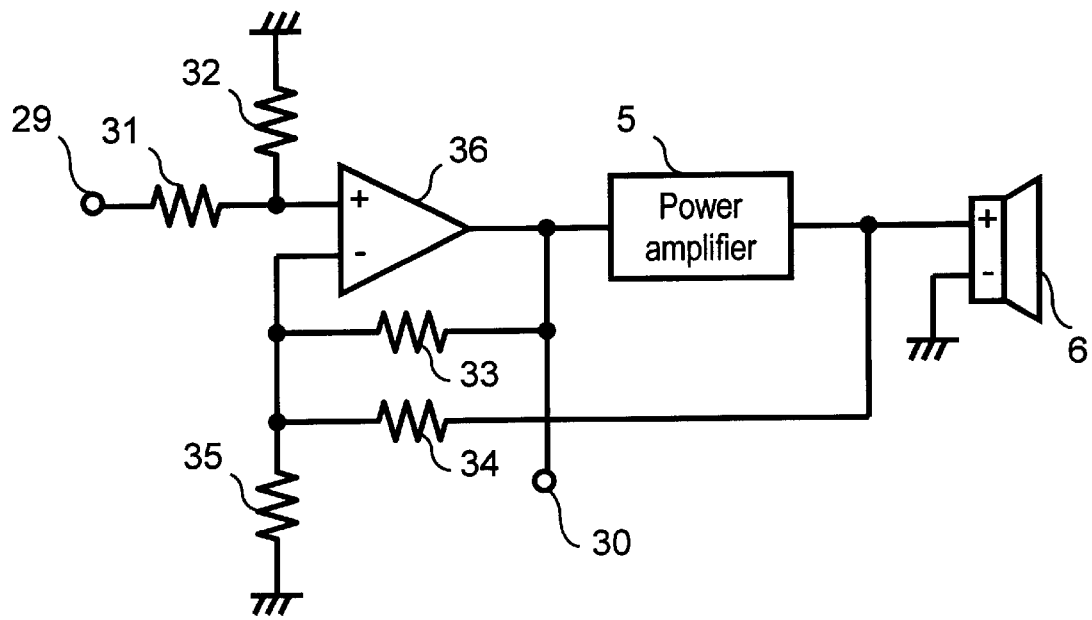
FIG. 9 is a block diagram depicting a power amplifier system of a fifth exemplary embodiment of the present invention.
Figure 10:
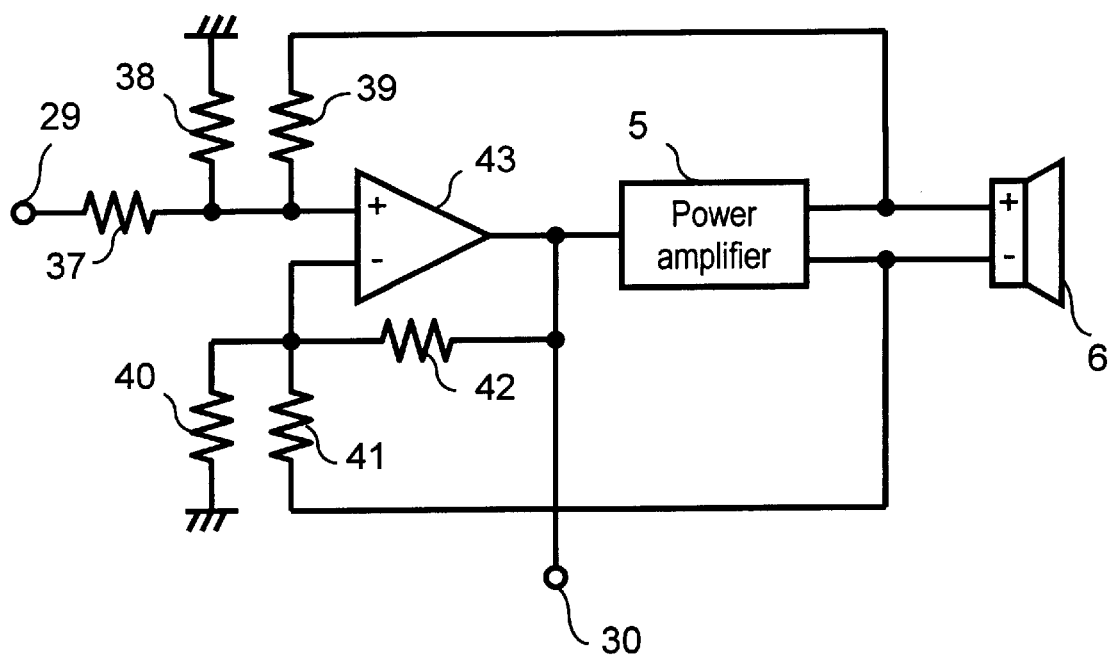
FIG. 10 is a block diagram depicting another example of the same system of FIG. 9; and, FIG. 11 is a block diagram depicting a power amplifier system of the prior art.
Figure 11:
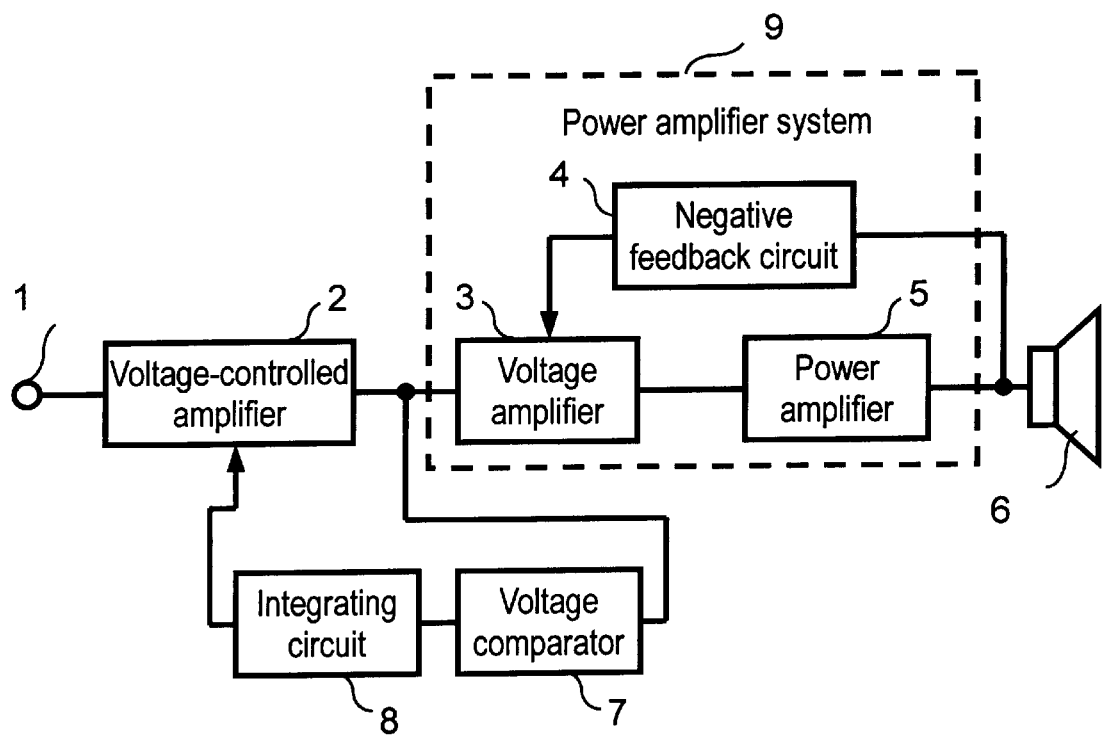

A fifth exemplary embodiment of the present invention is described by referring to FIGS. 9 and 10. FIG. 9 and FIG. 10 are block diagrams depicting the structure, which is described hereinafter. FIG. 9 depicts a structure, in which a power amplifier 5 furnishes a single output (output amplitude is gained in reference to an earth-ground), comprising a voltage amplification stage composed of an operational amplifier 36 and resistors 31 through 35 at a preceding stage of the power amplifier 5. An amplification factor of the voltage amplification stage is determined by the operational amplifier 36 and the resistors 31, 32, 33 and 35, and an overall amplification factor is determined by the resistor 34 as being a negative feedback resistor. Even if the power amplifier 5 can not be provided with a limiter detecting output, in case of a power IC for example, as in the above instance, it can be realized with an addition of a few circuits. In a similar manner, a block diagram is shown in FIG. 10, in which the power amplifier 5 has a BTL structure (two amplifiers output positive and negative signals). A limiter detecting output terminal 30 can be provided in the same manner as above by constituting a differential amplifier with an operational amplifier 43 and resistors 37 through 42 for the voltage amplification stage.

As has been described, a limiter circuit adopted in a power amplifier system of the present invention is capable of providing a normal musical signal at all times without producing an abnormal sound from a speaker, since it responds to a magnitude of an input voltage of the amplifier and fluctuation of power supply voltage, etc in order to avoid clipping of an output signal of a power amplifier.

What is claimed is:

1. A power amplifier system comprising:
   a voltage-controlled amplifier;
   a power amplifier;
   a voltage amplifier coupled between said voltage-controlled amplifier and said power amplifier;
   a negative feedback circuit for inputting an output from said power amplifier and for feeding said output back to said voltage amplifier;
   a voltage comparator for comparing a voltage, which is compensated through said negative feedback circuit, between said voltage amplifier and said power amplifier with a reference voltage; and
   limiter means for controlling said voltage-controlled amplifier based upon an output voltage of said voltage comparator.

2. A power amplifier system comprising:
   a voltage-controlled amplifier;
   a power amplifier;
   a voltage amplifier coupled between said voltage-controlled amplifier and said power amplifier;

first voltage comparator for providing a second voltage based upon a further comparison at a voltage at said connection between said voltage amplifier and said power amplifier with a further reference voltage;

a second voltage comparator for comparing an output voltage of said voltage-controlled amplifier with a reference voltage; and a limiter means for controlling said voltage-controlled amplifier based upon a sum of said first and second voltages of said first and second voltage comparators.

3. A power amplifier system comprising:

a voltage-controlled amplifier;

a power amplifier;

a voltage amplifier coupled between said voltage-controlled amplifier and said power amplifier;

a voltage comparator for comparing a voltage, which is a sum of a voltage between said voltage amplifier and said power amplifier, and an output voltage of said voltage-controlled amplifier with a reference voltage; and a limiter means for controlling said voltage-controlled amplifier based upon an output voltage of said voltage comparator.

4. The power amplifier system according to claim 3, wherein an amplification factor of said voltage amplifier is equal to or lower than an amplification factor of said power amplifier.

5. The power amplifier system according to claim 3, wherein said power amplifier is a single output system or a BTL output system.

6. The power amplifier system according to claim 2, wherein an amplification factor of said voltage amplifier is equal to or lower than an amplification factor of said power amplifier.

7. The power amplifier system according to claim 1, wherein an amplification factor of said voltage amplifier is equal to or lower than an amplification factor of said power amplifier.

8. The power amplifier system according to claim 2, wherein said power amplifier is a single output system or a BTL output system.

9. The power amplifier system according to claim 1, wherein said power amplifier is a single output system or a BTL output system.

10. A power amplifier system comprising:

a voltage-controlled amplifier;

a voltage amplifier for inputting an output voltage from said voltage-controlled amplifier;

a power amplifier for inputting an output voltage from said voltage amplifier;

a negative feedback circuit for inputting an output from said power amplifier and for feeding said output back to said voltage amplifier;

limiter means for inputting the output voltage from said voltage amplifier and the output voltage from said voltage-controlled amplifier, and for controlling said voltage-controlled amplifier based on the output voltage of said voltage amplifier and the output voltage of said voltage-controlled amplifier.

11. The power amplifier system according to claim 10, said limiter means comprising:

a first voltage comparator for comparing an inverted voltage of the output voltage from said voltage amplifier with a first reference voltage;

a second voltage comparator for comparing an output voltage from said voltage-controlled amplifier with a second reference voltage;

wherein said limiter means controls said voltage-controlled amplifier based on a sum of the output voltage of said first voltage comparator and the output voltage of said second voltage comparator.

12. The power amplifier system according to claim 10, said limiter means comprising:

a voltage comparator for adding the output voltage from said voltage amplifier and the output voltage from said voltage-controlled amplifier and for comparing the added voltages with a reference voltage;

wherein said limiter means controls said voltage-controlled amplifier based on the output voltage of said voltage comparator.

13. The power amplifier system according to claim 12, wherein an amplification factor of said voltage amplifier is equal to or lower than an amplification factor of said power amplifier.

14. The power amplifier system according to claim 11, wherein an amplification factor of said voltage amplifier is equal to or lower than an amplification factor of said power amplifier.

15. The power amplifier system according to claim 10, wherein an amplification factor of said voltage amplifier is equal to or lower than an amplification factor of said power amplifier.

16. The power amplifier system according to claim 12, wherein said power amplifier is a single output system or a BTL output system.

17. The power amplifier system according to claim 11, wherein said power amplifier is a single output system or a BTL output system.

18. The power amplifier system according to claim 10, wherein said power amplifier is a single output system or a BTL output system.

19. The power amplifier system according to claim 12, wherein said voltage comparator is a window comparator.

20. The power amplifier system according to claim 11, wherein said voltage comparator is a window comparator.

* * * * *